United States Patent
Jelonnek et al.

(10) Patent No.: US 7,249,008 B2
(45) Date of Patent: Jul. 24, 2007

(54) ARRANGEMENT FOR RUNTIME COMPENSATION OF A RUNTIME DIFFERENCE ARISING THROUGH EMULATION OF A HIGH FREQUENCY SIGNAL

(75) Inventors: Björn Jelonnek, Ulm (DE); Armin Splett, Ulm (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 672 days.

(21) Appl. No.: 10/470,413

(22) PCT Filed: Jan. 23, 2002

(86) PCT No.: PCT/EP02/00656

§ 371 (c)(1),
(2), (4) Date: Jul. 29, 2003

(87) PCT Pub. No.: WO02/061947

PCT Pub. Date: Aug. 8, 2002

(65) Prior Publication Data

US 2004/0049373 A1    Mar. 11, 2004

(30) Foreign Application Priority Data

Jan. 29, 2001 (DE) ................ 101 03 812
Jan. 29, 2001 (EP) ................ 01101968

(51) Int. Cl.
*G06F 7/60* (2006.01)
*G06F 17/10* (2006.01)
*G06F 9/455* (2006.01)
*H03C 3/00* (2006.01)
*H04L 27/12* (2006.01)
*H03K 7/06* (2006.01)

(52) U.S. Cl. .............. 703/2; 703/23; 332/100; 375/303

(58) Field of Classification Search ........... 703/2, 703/23; 375/303; 332/100
See application file for complete search history.

(56) References Cited

U.S. PATENT DOCUMENTS 6,008,703 A * 12/1999 Perrott et al. ............ 332/100
6,285,719 B1 * 9/2001 Sobel .................... 375/259

FOREIGN PATENT DOCUMENTS

EP    0 454 406 A1    10/1991
JP    8-330968    12/1996

OTHER PUBLICATIONS

Martin et al., "On Digital Systems with Negative Group Delay", Frequenz, 47 (1993) May/Jun., No. 5/6, Berlin, Germany, pp. 106-113.

* cited by examiner

*Primary Examiner*—Paul Rodriguez
*Assistant Examiner*—Dwin McTaggart Craig
(74) *Attorney, Agent, or Firm*—Staas & Halsey LLP

(57) ABSTRACT

An arrangement for runtime compensation of a runtime difference, arising through emulation of a high frequency signal, is disclosed, with a signal x(t), for emulation by a signal processing device, which emulates the signal x(t) with a signal x(t) and a device for determining a difference signal between the signals x(t) and x(t). The arrangement is characterized in that the emulated signal x(t) is conducted via filter with a negative group runtime for certain frequency ranges.

17 Claims, 5 Drawing Sheets

ARRANGEMENT FOR RUNTIME COMPENSATION OF A RUNTIME DIFFERENCE ARISING THROUGH EMULATION OF A HIGH FREQUENCY SIGNAL

CROSS REFERENCE TO RELATED APPLICATIONS

This application is based on and hereby claims priority to PCT Application No. PCT/EP02/00656 filed on and 23 Jan. 2002 and German Application No. 101 03 812.7 filed on 29 Jan. 2001 and European Application No. 011 01 968.4 filed on 29 Jan. 2001, the contents of which are hereby incorporated by reference.

BACKGROUND OF THE INVENTION

The present invention relates to an arrangement for runtime compensation of a runtime difference arising through emulation of a high frequency signal.

High frequency signals, transmitted by any transmission systems of a linear or non-linear nature, such as amplifier chains for example, can be emulated by signal processing devices. One example of a transmission system is set out in the patent application filed by the applicant with the same application date, relating to a sigma-delta modulator for digitizing analog high frequency signals. Ideally the signal emulation of the output signal of the transmission system proceeds without a time delay in relation to the original signal, so that the precisely emulated signal components of the emulated signal extinguish the original signal completely in a difference signal.

Practical instances of signal emulation however generally result in a runtime difference between the emulated signal and the original signal. As can be clarified below, the time delay of the emulated signal results in extinction of the signal components in a certain frequency range only. Here x(t) designates the original output signal of the transmission system and $\hat{x}(t)$ the emulated signal; $\tau$ stands for the runtime difference of the emulated signal.

The following equation applies $$x(t)-\hat{x}(t) \approx x(t)-x(t-\tau) \Leftrightarrow X(j\omega)-e^{-j\omega\tau}X(j\omega)=X(j\omega)\cdot(1-e^{-j\omega\tau})$$

In order to achieve broadband signal extinction, runtime elements are commonly used, which delay the signal x(t) by the period of the runtime difference $\tau$ of signal emulation $\hat{x}(t)$.

$$x(t-\tau)-\hat{x}(t) \approx x(t-\tau)-x(t-\tau)=0$$

The highly linear runtime elements used for this are technically expensive due to the high level of spectral purity of the signal x(t) and give rise to high manufacturing costs.

SUMMARY OF THE INVENTION

One possible object of the invention is therefore to create an arrangement for runtime compensation of a runtime difference arising through emulation of a high frequency signal, which allows broadband signal emulation and is simple to set up from a technical point of view.

This object may be achieved by an arrangement for runtime compensation of a runtime difference arising through emulation of a high frequency signal with a signal to be emulated x(t), with a signal processing device, which emulates the signal x(t) with a signal $\hat{x}(t)$, and with a device for determining a difference signal between the signals x(t) and $\hat{x}(t)$, which is characterized in that the emulated signal $\hat{x}(t)$ is routed via a filter with a negative group runtime for certain frequency ranges. The parameters of the filter are selected so that the overall transmission function of the difference signal in the required frequency range has zeros or is significantly attenuated. This means that the runtime difference arising from signal emulation is compensated to the maximum degree possible in this frequency range.

According to one embodiment of the invention the signal x(t) forms the output signal of a transmission signal and a signal u(t) forms the input signal of the transmission system. The transmission system here can comprise an amplifier or even an amplifier chain. However any linear or non-linear transmission system can be used.

According to a further embodiment of the invention the arrangement has a regulation device, which can be used to modify the emulated signal $\hat{x}(t)$, so that the difference signal is minimal.

The difference signal for regulating signal emulation is preferably routed to the signal processing device.

According to one embodiment of the invention a signal evaluation unit is provided, which evaluates the difference signal and routes the evaluated signal to the signal processing device.

According to a preferred embodiment of the invention, the analog input signal for controlling signal emulation is routed to the signal processing device.

The filter preferably has runtime elements, which delay the digital signal.

A linear filter is preferably used to achieve the object. An FIR, IIR or any other linear filter can for example be used.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
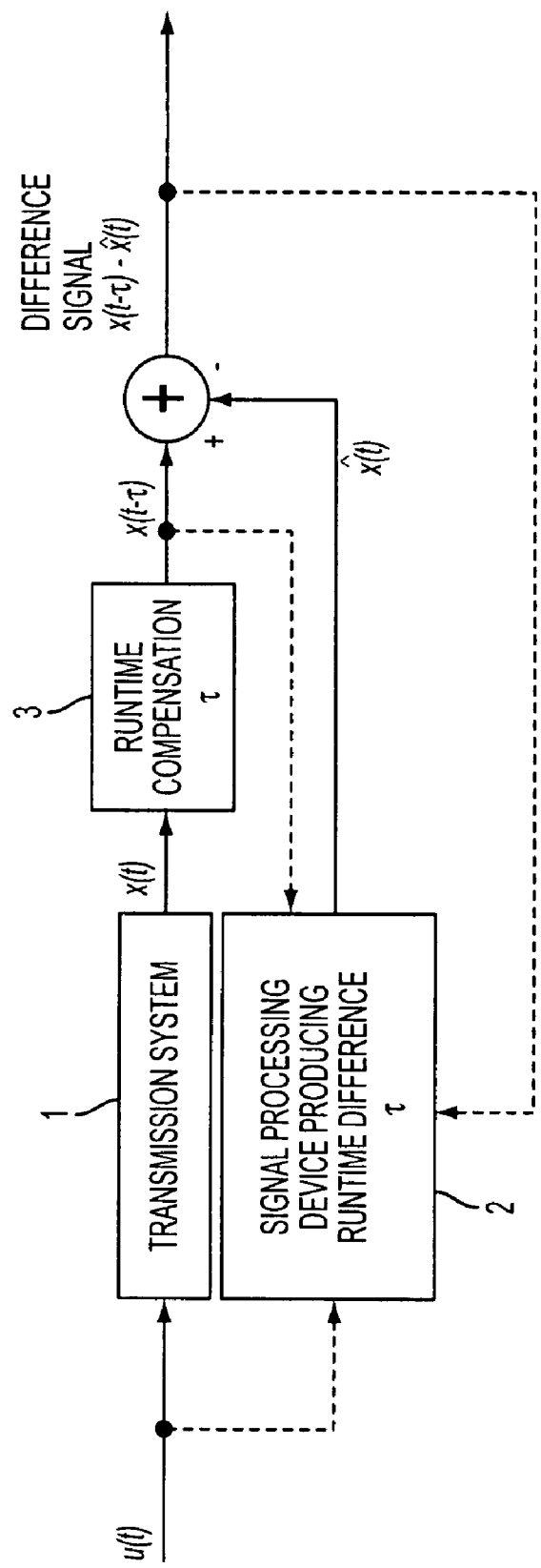
FIG. 1 is an illustration of a system for signal emulation according to the related art.

Reference will now be made in detail to the preferred embodiments of the present invention, examples of which are illustrated in the accompanying drawings, wherein like reference numerals refer to like elements throughout The arrangement shown in FIG. 1 for signal emulation, as known from the related art, has an input signal u(t), which is transmitted by any linear or non-linear transmission system 1. The signal x(t) is present at the output of the transmission system 1. The signal x(t) is emulated in the signal processing device 2 with runtime differences, i.e. delays, arising in relation to the signal x(t). The signal $\hat{x}(t)$ is present at the output of the signal processing device 2. A runtime element 3 is provided for the signal x(t) to compensate for runtime differences and this delays the signal x(t) for a time τ. Here τ is preferably selected so that it corresponds to the runtime difference produced by the signal processing device 2. Assuming ideal signal emulation and a delay τ, which corresponds precisely to the signal delay produced by signal emulation, the following applies for the difference signal x(t−τ)−x̂(t) created from x̂(t) and the delayed signal x(t−τ) for all frequencies $$x(t-\tau)-\hat{x}(t)=0$$

A control loop can be created to improve signal emulation and this transmits the difference signal, which is usually not equal to 0, to the signal processing device 2. The delayed signal x(t−τ) can also be used as a control variable.

Figure 2:
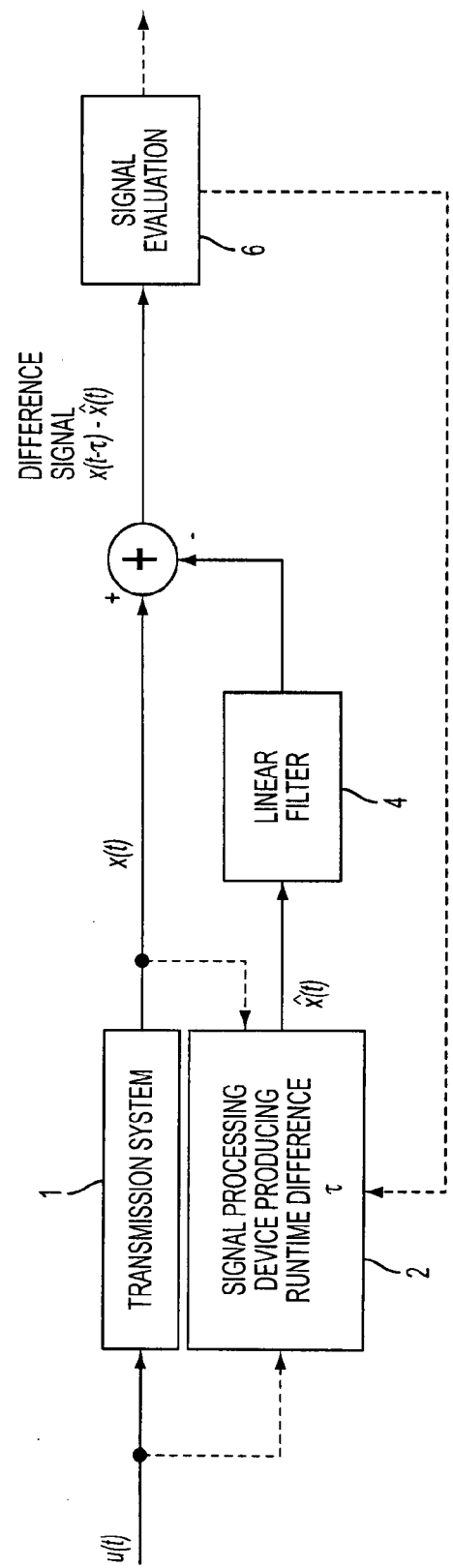
FIG. 2 is an illustration of a system, according to one aspect of the invention, for signal emulation.

With the system there may be no need to use a runtime element to compensate for the runtime difference. An illustration of the system is shown in FIG. 2.

The emulated signal x̂(t) is passed as the input signal to a linear filter 4. An FIR, IIR or any other linear filter can be used here. The coefficients of the linear filter are selected so that for certain frequency ranges the runtime difference produced by the signal processing device 2 is compensated for by the linear filter. In certain frequency ranges the filter used has a negative group runtime but is still causal and therefore feasible because of positive group runtimes in other frequency ranges, i.e. signal delays. In this way signal emulation is achieved in the required frequency range, which is a broader band compared with previous solutions and is simple to set up because of the digital filters used. The difference signal formed at the summing unit 5 can be used as a control variable for the signal processing device 2. It is however conceivable for an evaluation result of the difference signal to be used as the control variable. A signal evaluation unit 6 is used for this and converts the difference signal into a Taylor series for example. Other types of signal breakdown can also be used.

A further example of signal breakdown is the spectral analysis (Fourier analysis) of the difference signal. The object is to minimize the power of the difference signal within a sub-band. For this it is sufficient to send to the signal processing device 2 those results of the spectral analysis of the difference signal, which describe the frequency response within the relevant sub-band.

The power of the error signal (difference signal) within the relevant frequency band can be used as a further alternative parametric control variable.

Figure 3:
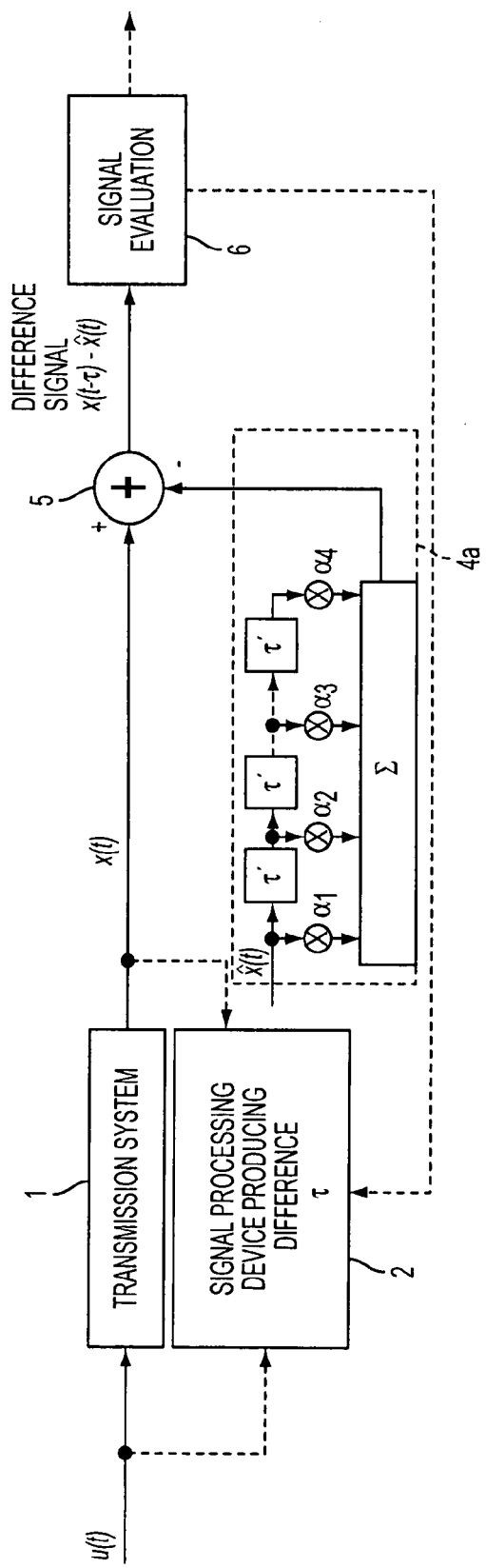
FIG. 3 is an illustration of a further embodiment of a system according to the invention for signal emulation.

An embodiment of the invention is described below using an example according to FIG. 3. In this example an FIR filter 4a is used to achieve negative group runtime for certain frequency ranges. Runtime compensation is to be carried out in the low-pass range. The following is to apply for the delay elements τ' of the filter $$\tau'=\tau,$$

i.e. the delay elements t' of the filter each correspond to the runtime difference t of the signal processing device. The starting point is established by a linear filter design with good attenuation at the frequency ω=0:

$$H_{Design} = 1 - \sum_{l=1}^{q-1} a_l z^{-l}$$

where q=1, 2, 3, . . . and l=1, 2, 3, . . . .

In this example $$H_{Design}=(1-z^{-1})^\nu$$

is selected with ν=2 and z=$e^{j\omega\tau}$. The following therefore results at the output of the summing unit 5 for the difference signal y(t)

$$y(t) = x(t) + \sum_{l=1}^{q-1} a_l \hat{x}(t-(l-1)\tau)$$
$$= x(t) - 2\hat{x}(t) + \hat{x}(t-\tau) \approx x(t) - 2x(t-\tau) + x(t-2\tau)$$

The following follows from the linearity of the Fourier transformation $$Y(e^{j\omega}) = (1 - e^{-j\omega\tau})^2 X(e^{j\omega}) = (1 - 2e^{-j\omega\tau} + e^{-j\omega 2\tau})X(e^{j\omega})$$
$$= X(e^{j\omega}) - 2e^{-j\omega\tau}X(e^{j\omega}) + e^{-j\omega 2\tau}X(e^{j\omega})$$

corresponds to $$y(t)=x(t)-2x(t-\tau)+x(t+2\tau)$$

The definition of group runtime according to K. D. Kammeyer, Nachrichtenübertragung (Message Transmission), Teubner Stuttgart 1996, is as follows $$\tau_g(\omega) = -\frac{d\phi(\omega)}{d\omega}$$

Frequency response of the relevant sub-system $$H_{Sub}=2-e^{-j\omega\tau}$$

At frequencies ωτ≈2π, $e^{-j\omega 2\pi}$≈1−j (ωτ−2π) (Taylor series development). The following then applies approximately $$H_{Sub}=2-(1-j(\omega\tau-2\pi))=1+j(\omega\tau-2\pi))$$

The phase is approximately ωτ−2π, the differential derivation to ω results in negative values: −τ is the group runtime to be compensated.

Therefore the coefficients $\alpha_1 \ldots \alpha_n$ are selected as follows for the filter shown: $\alpha_1=2$, $\alpha_2=-1$ and $\alpha_3 \ldots \alpha_n=0$.

Figure 4:
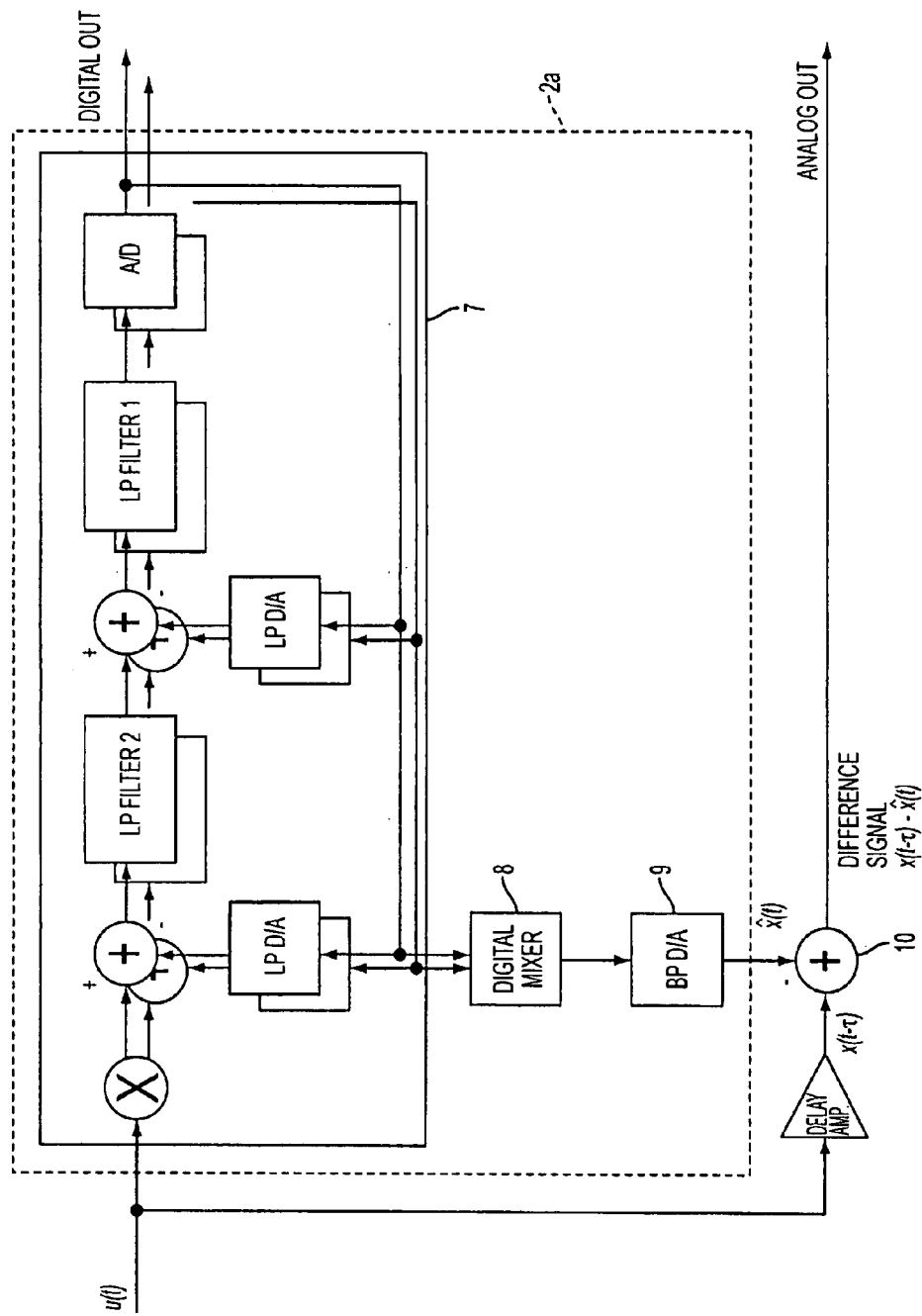
FIG. 4 is an illustration of an example of the application of the system according to the invention for signal emulation.

A specific example of the application of the invention is shown in FIG. 4. A cascade stage of an analog-digital converter system with a low-pass sigma-delta modulator 7 is shown, which is the subject of a further patent application by the applicant. The digital signal emulation of the analog input signal u(t) is achieved here byf the low-pass sigma-delta modulator 7. The two output signals of a signal processing device 2a, result from the multiplication of the input signal u(t) and a sin or cos signal and are designated as inphase or quadrature components, are combined again to form a signal in the digital mixer 8 and then converted to analog in a band-pass digital-analog converter 9. The output signal of the band-pass digital-analog converter 9 is routed with a negative sign to a summing unit 10. The input signal u(t) is amplified for amplitude adjustment in an amplifier 11 and reaches the summing unit 10. According to the related art the signal u(t) is also delayed in order to compensate for the delay to the input signal introduced by the signal processing device 2a.

Figure 5:
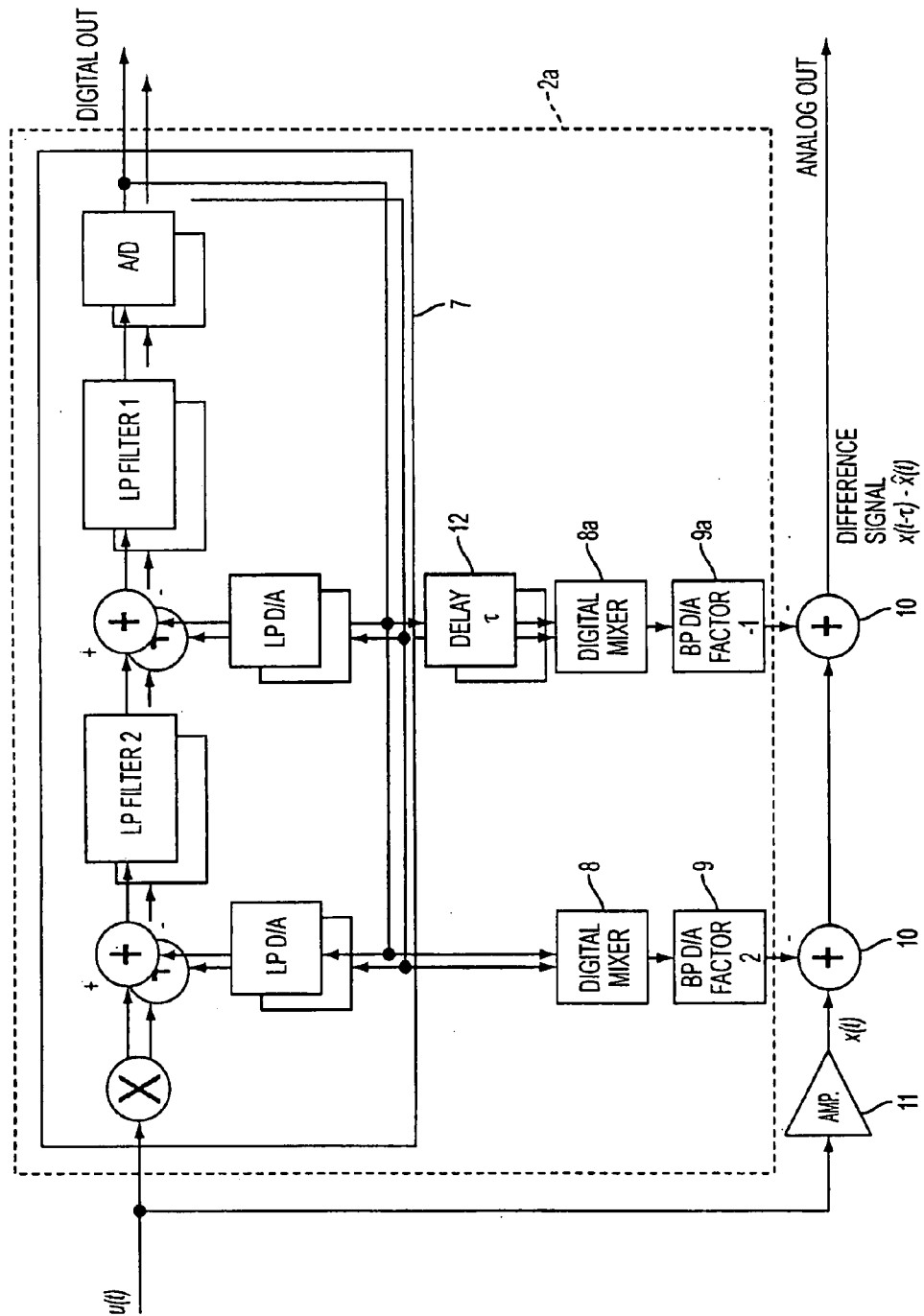
FIG. 5 is an illustration of a second embodiment of a system according to the invention for signal emulation.

Achievement of runtime compensation based on the example of an application shown in FIG. 4 is shown in FIG. 5. A digital filter with the coefficients $\alpha_1=2$ and $\alpha_2=-1$ is used here. As disclosed above, this filter has a high level of attenuation at ω=0. The inphase and quadrature components of the low-pass sigma-delta modulator 7 are routed via a digital mixer 8, multiplied by the coefficient $\alpha_1=2$ and converted to an analog signal in a band-pass digital-analog converter 9.

The signal with a negative sign is then routed to a summing unit 10. The inphase and quadrature components of the low-pass sigma-delta modulator 7 are delayed by τ in a delay element 12, combined in a mixer 8a and multiplied by the coefficient $\alpha_2=-1$. After conversion to an analog signal in a band-pass digital-analog converter 9a, the signal is routed to the summing unit 10 with a negative sign. The input signal u(t) undergoes an amplitude adjustment by an amplifier 11 but is not delayed as in FIG. 4. The filter downstream from the digital mixer means that frequencies in the range ω=2π have a negative group runtime, so the delay produced by the signal processing device 2a is compensated for this frequency range. In other frequency ranges the group runtime is positive but the output signal is still band-limited, so no additional restriction results due to the digital filter.

The invention has been described in detail with particular reference to preferred embodiments thereof and examples, but it will be understood that variations and modifications can be effected within the spirit and scope of the invention.

The invention claimed is:

1. A system for runtime compensation of a runtime difference produced by emulating a high-frequency signal, comprising:
    a transfer unit which receives an input signal and produces an output signal x(t);
    a signal processing unit, which receives the output signal x(t) and emulates the signal x(t) by producing an emulated signal x̂(t), the signal processing unit causing the runtime difference;
    a difference unit to determine a difference signal between the signals x(t) and x̂(t); and
    a filter through which the emulated signal x̂(t) is routed, the filter being connected between the signal processing unit and the difference unit to filter the emulated signal x̂(t) before the emulated signal x̂(t) is fed to the difference unit the filter having a negative group runtime in a certain frequency range.

2. The system according to claim 1, further comprising a regulation device, to modify the emulated signal x̂(t) so that the difference signal becomes minimal.

3. The system according to claim 2, wherein
    the regulation device is provided at the signal processing device,
    the regulation device receives the difference signal, and
    the difference signal is routed to the signal processing device.

4. The system according to claim 1, wherein further comprising a signal evaluation unit, which evaluates the difference signal and produces an evaluated signal that is routed to the signal processing device.

5. The system according to claim 1, wherein
    the input signal is an analog input signal,
    the input signal is supplied to the signal processing unit, and
    the input signal controls signal emulation.

6. The system according to claim 1, wherein the filter has runtime elements.

7. The system according to claim 1, wherein the filter is linear.

8. The system according to claim 1, wherein the filter is an FIR filter.

9. The system according to claim 1, wherein the filter is an IIR filter.

10. A system according to claim 1, wherein the signal processing device comprises an analog to digital converter.

11. The system according to claim 3, wherein further comprising a signal evaluation unit, which evaluates the difference signal and produces an evaluated signal that is routed to the signal processing device.

12. The system according to claim 11, wherein
    the input signal is an analog input signal,
    the input signal is supplied to the signal processing unit, and
    the input signal controls signal emulation.

13. The system according to claim 12, wherein the filter has runtime elements.

14. The system according to claim 13, wherein the filter is linear.

15. The system according to claim 14, wherein the filter is an FIR filter.

16. The system according to claim 14, wherein the filter is an IIR filter.

17. A system according to claim 14, wherein the signal processing device comprises an analog to digital converter.

* * * * *